(12) United States Patent
Polizzi et al.

(10) Patent No.: US 7,151,705 B2
(45) Date of Patent: Dec. 19, 2006

(54) NON-VOLATILE MEMORY DEVICE ARCHITECTURE, FOR INSTANCE A FLASH KIND, HAVING A SERIAL COMMUNICATION INTERFACE

(75) Inventors: Salvatore Polizzi, Palermo (IT); Maurizio Francesco Perroni, Furnari (IT); Paolino Schillaci, Casteltermini (IT)

(73) Assignee: STMicroelectronics, S.r.l. (IT)

( * ) Notice: Subject to any disclaimer, the term of this patent is extended or adjusted under 35 U.S.C. 154(b) by 152 days.

(21) Appl. No.: 10/727,341

(22) Filed: Nov. 26, 2003

(65) Prior Publication Data

US 2005/0213421 A1   Sep. 29, 2005

(30) Foreign Application Priority Data

Nov. 28, 2002   (EP) .................................. 02425730

(51) Int. Cl.
*G11C 7/00* (2006.01)
*G11C 8/00* (2006.01)
(52) U.S. Cl. ............ 365/201; 365/189.05; 365/189.12; 365/220; 365/221
(58) Field of Classification Search ................ 365/220, 365/221, 189.05, 189.12, 201
See application file for complete search history.

(56) References Cited

U.S. PATENT DOCUMENTS

| 4,897,818 | A | * | 1/1990 | Redwine et al. ............ 365/221 |
| 5,808,929 | A | | 9/1998 | Sheikholeslami et al. |
| 5,966,723 | A | | 10/1999 | James et al. |
| 6,466,505 | B1 | | 10/2002 | Landry |
| 6,510,487 | B1 | * | 1/2003 | Raza et al. .................. 711/100 |
| 6,777,979 | B1 | * | 8/2004 | Zhu et al. ..................... 326/41 |

OTHER PUBLICATIONS

European Search Report, EP 02425730, Apr. 10, 2003.

* cited by examiner

*Primary Examiner*—Son T. Dinh
(74) *Attorney, Agent, or Firm*—Lisa K. Jorgenson; Paul F. Rusyn; Graybeal Jackson Haley LLP

(57) ABSTRACT

The present invention relates to a non volatile memory device architecture, for example of the Flash type, incorporating a memory cell array and an input/output interface to receive memory data and/or addresses from and to the outside of the device. The interface operates generally according to a serial communication protocol, but it is equipped with a further pseudo-parallel communication portion with a low pin number incorporating circuit blocks for selecting the one or the other communication mode against an input-received selection signal.

24 Claims, 7 Drawing Sheets

NON-VOLATILE MEMORY DEVICE ARCHITECTURE, FOR INSTANCE A FLASH KIND, HAVING A SERIAL COMMUNICATION INTERFACE

PRIORITY CLAIM

This application claims priority from European patent application No. 02425730.5, filed Nov. 28, 2002, which is incorporated herein by reference.

TECHNICAL FIELD

The present invention relates to a non volatile memory device architecture, for instance a Flash kind, having a serial communication interface, in particular for applications with Serial Protocol Interface (SPI) serial communication protocols.

More specifically, but not exclusively, the invention relates to a standard Flash memory integrated in an input/output interface block to receive memory data and/or addresses from and toward the outside of the device, said interface operating according to a SPI serial communication protocol.

The invention relates to the development of integrated non volatile memories having a SPI (serial Protocol Interface) serial communication interface, but the following description is made with reference to this field of application for convenience of illustration only.

BACKGROUND

As it is well known in this specific technical field, a standard Flash EEPROM memory device is integrated on semiconductor with a serial communication interface equipped with an input pin INPUT PAD, an output pin OUTPUT PAD, a system clock signal pin CK_PAD and some other control pins, like SELECT_PAD.

The block scheme, of FIG. 1 shows the most important memory device blocks and the SPI serial interface.

Up to now the serial interface of a non volatile Flash memory has been used in the applications according to a precise communication protocol. Another parallel interface has however been used almost exclusively in the device testing phase, in order to reduce the testing time.

Essentially, all the addresses and data being considered are used in the parallel mode, while only the clock signal CLK and the other four pins are necessary for the serial communication protocol.

The memory device receives through the input pin all protocol codes and all information concerning the addresses, the latter being parallelised by the SPI interface and brought to the flash memory through the address bus ADDR<20:0>.

Afterwards, for example in a reading operation, read data are forced by the Flash Core onto the data bus DBUS<15:0> and subsequently serialised and brought outside by means of the output pin.

The system clock scans the several protocol phases according to the timing sequence shown in FIG. 2.

As shown in this FIG. 2, the falling edge of the signal applied to the pin SELECT_PAD turns the memory device on and enables all input buffers, the first eight clock beats serve for the instruction code (Read, Write, etc.), the following twenty-four clock beats serve to move to the location address wished to be read or written, they follow therefore the beats required to synchronize the output data on OUTPUT_PAD.

The output bit number is not previously fixed but it can be set by the user through the SELECT_PAD, the last signal rising edge indicating the end of a reading operation.

At present, the testing flux software at both EWS (on-wafer-testing) and Final Test (assembled device testing) level has been conceived for a parallel-mode operation.

The need to produce low-cost packages leads inevitably to the reduction of the external pin number with subsequent need for a new testing flow, resulting therefore in devices having externally only the pins required by the serial communication mode with the corresponding and necessary control pins for this mode.

There are devices allowing to perform reading/writing operations on flash memories by using a system clock signal scanning the phases of a precise communication protocol at working frequencies of 25 MHz.

One of the great disadvantages in the development and industrialization of this kind of devices is the cost in terms of testing time especially in the EWS phase.

In fact, the whole flux serial execution involves a considerable waste of time.

The technical problem underlying embodiments of the present invention is to provide a non volatile Flash memory architecture equipped with an input/output interface, particularly for SPI serial communication protocol applications, having such structural and functional characteristics as to allow a fast and low-cost testing flux operating yet in the serial mode.

SUMMARY

The solution underlying an aspect of the present invention is to provide a sole input/output interface capable of performing both functions of the serial and parallel type, but with a reduced pin number. Essentially, the parallel operation modes are emulated by the serial interface.

The features and advantages of the non volatile memory architecture according to the various aspects of the present invention will be apparent from the following description of an embodiment thereof given by way of non-limiting example with reference to the attached drawings.

DETAILED DESCRIPTION

Figure 1:
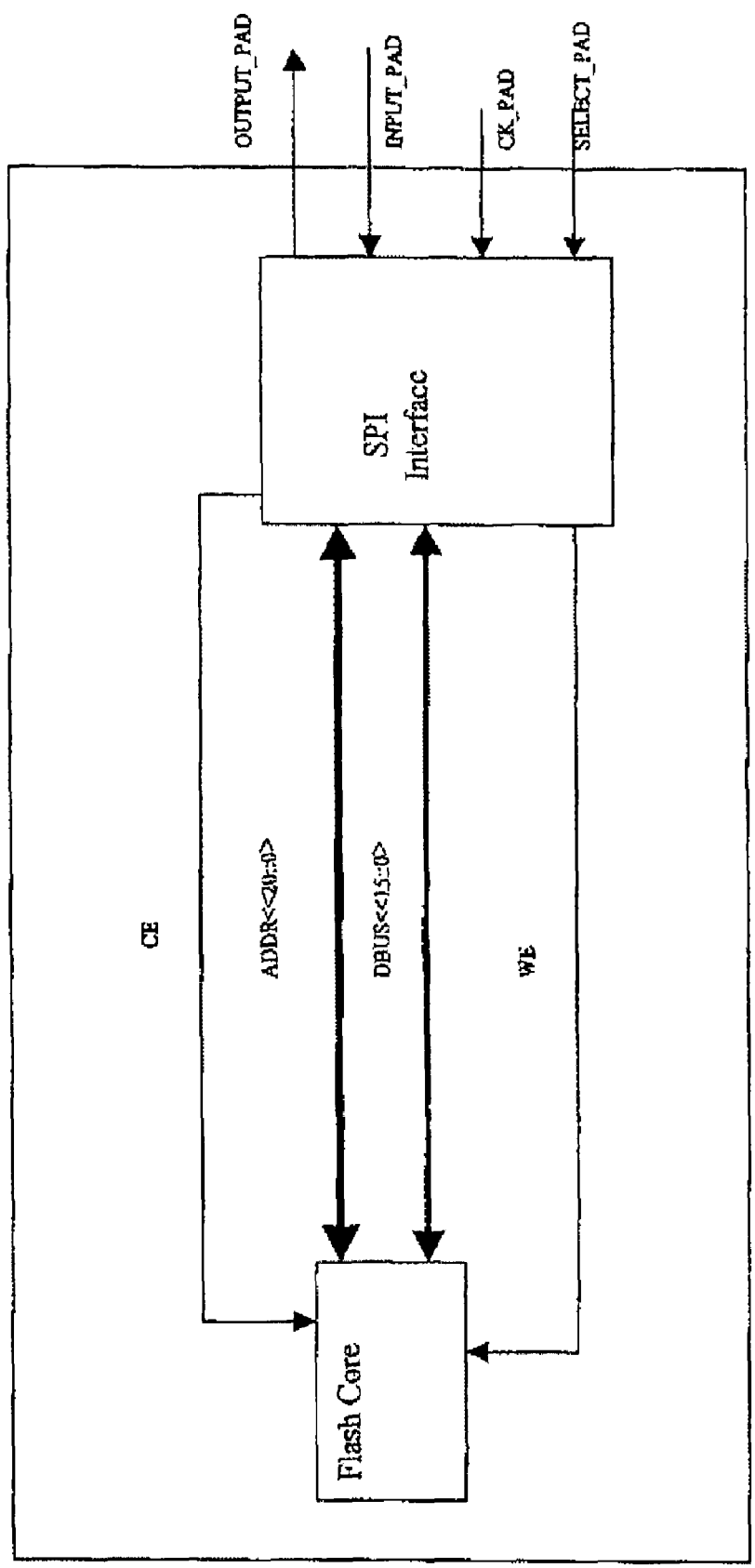
FIG. 1 shows schematically a non volatile memory device architecture according to the prior art.
Figure 2:
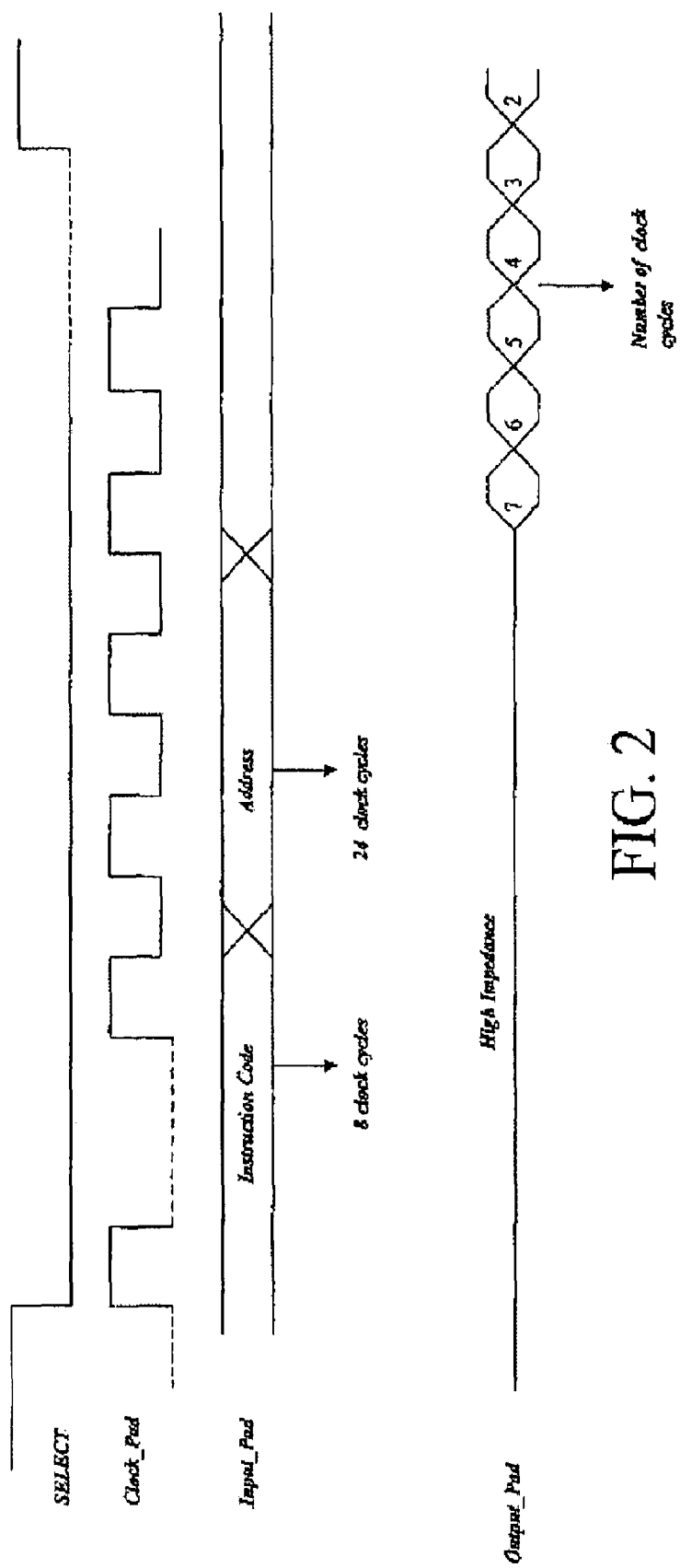
FIG. 2 shows schematically in an equal-time-based diagram a set of signals applied to and emitted by the memory device of FIG. 1 in accordance with a serial testing protocol according to the prior art.
Figure 3:
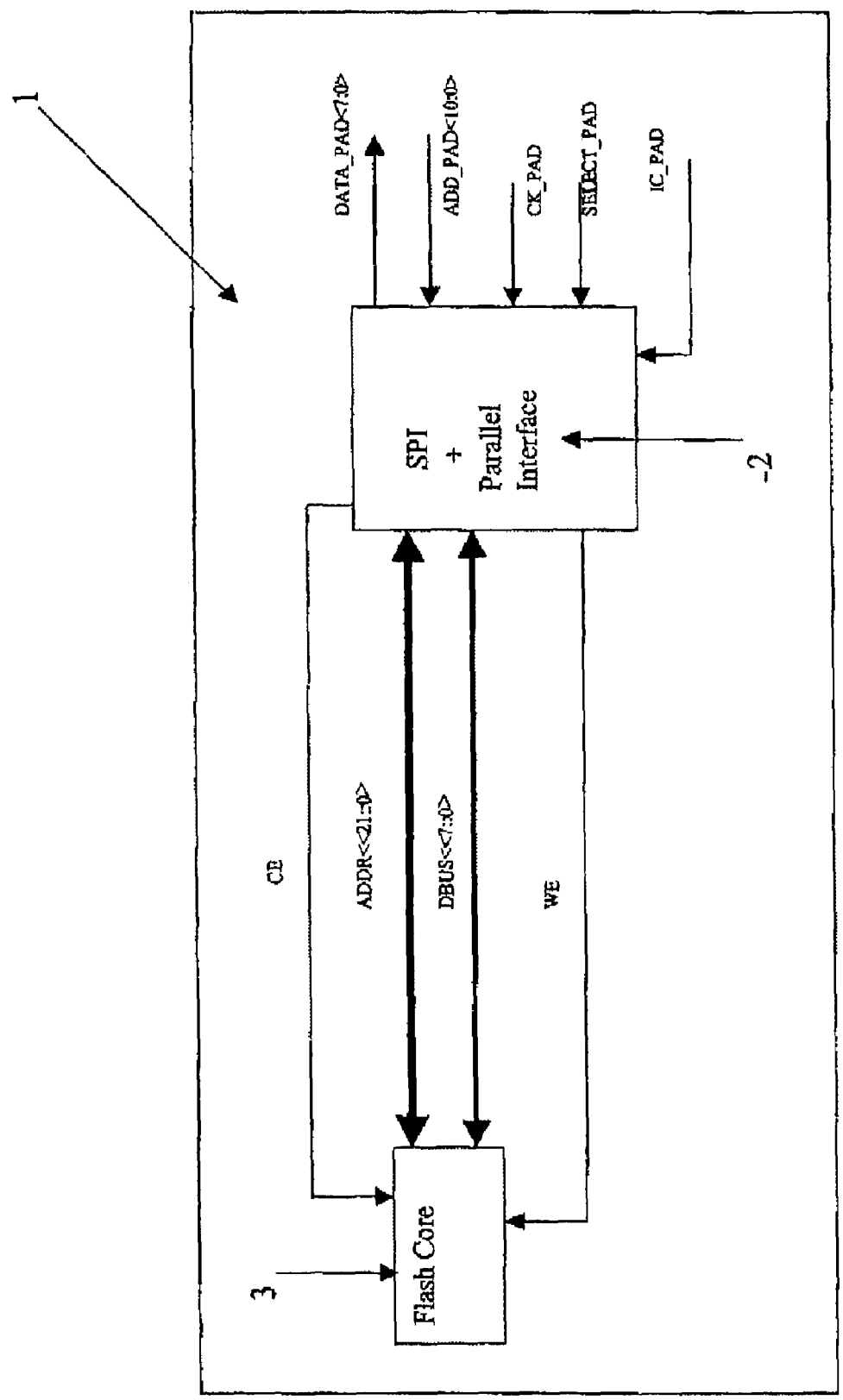
FIG. 3 shows schematically an example of a non volatile memory device architecture according to an embodiment of the invention.

With reference to the drawings, and particularly to the examples of FIG. 3 and the following ones, the semiconductor-integrated non volatile memory device architecture with an input/output interface 2 is globally and schematically indicated with 1.

Memory device means any monolithical electronic system incorporating a matrix of memory cells 3, organized in rows and columns, as well as circuit portions associated to the cell matrix and in charge of the addressing, decoding, reading, writing and erasing functions of the memory cell content.

A device of this kind can be for example a semiconductor-integrated memory chip and of the non volatile EEPROM Flash type spilt in sectors and electrically erasable.

As it is known, each memory cell comprises a floating gate transistor having source, drain and control gate terminals.

Among the circuit portions associated to the cell matrix a row decoding circuit portion is provided, which is associated to each sector and supplied with specific positive and negative voltages generated internally in the integrated memory circuit by means of positive voltage boosters or charge pumps and regulated by means of corresponding voltage regulators.

Advantageously, according to an embodiment of the present invention, device 1 is equipped also with a pseudo-parallel interface 2 with a low pin number and it exploits some preexistent circuit structures in order to reduce the testing cost of the device itself.

The pseudo-parallel mode here provided requires at least eleven address pins and eight data pins.

In particular device 1 is equipped with all the pads necessary for a complete debut at the EWS level, while at the package level only the pads necessary for the SPI serial mode operation will be then connected. Consequently, the package of the semiconductor memory device has only eight pins.

Figure 4:
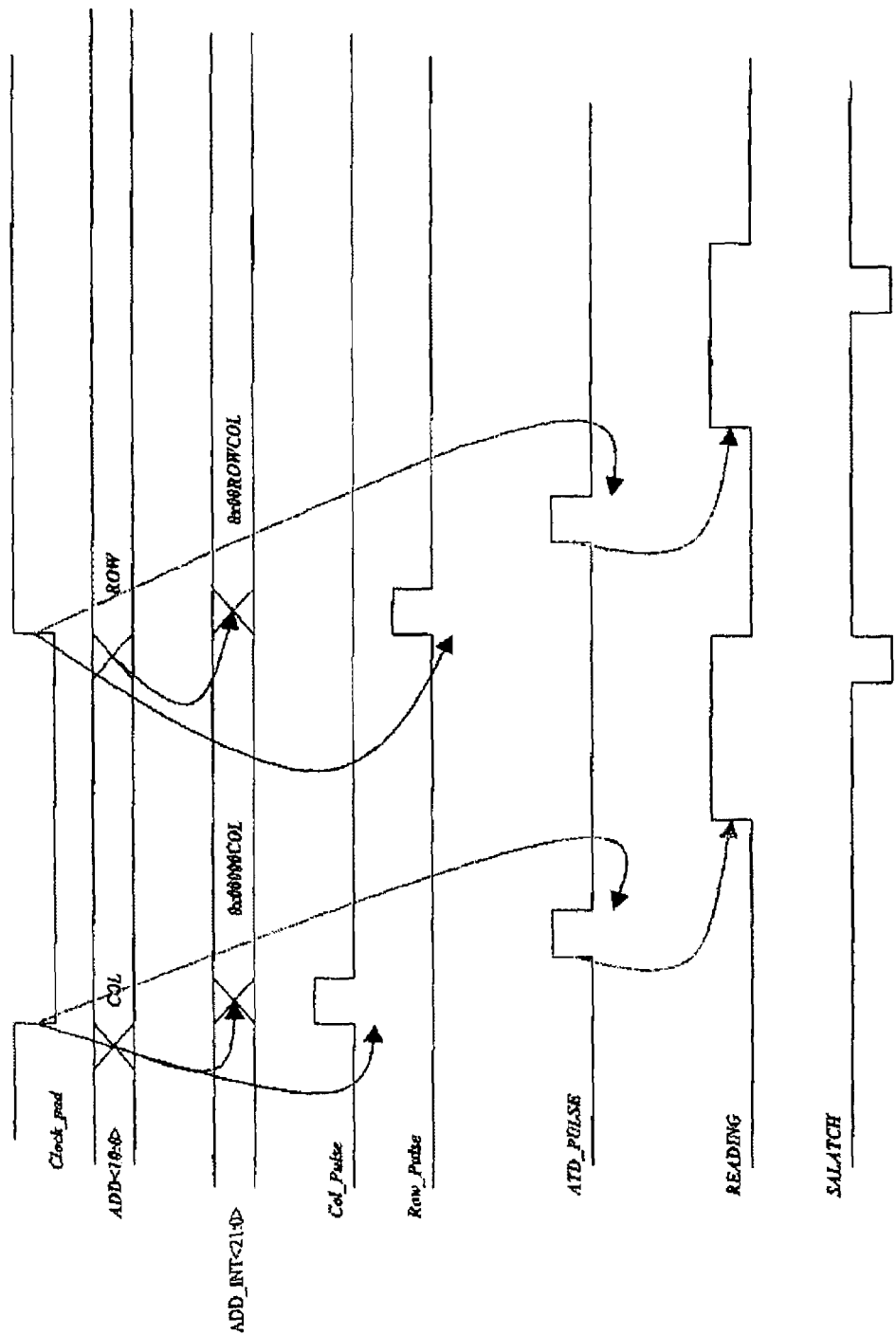
FIG. 4 shows schematically on an equal-time-based diagram a set of signals applied to and emitted by the memory device of FIG. 3 in accordance with a testing protocol according to an embodiment of the invention.
Figure 5:
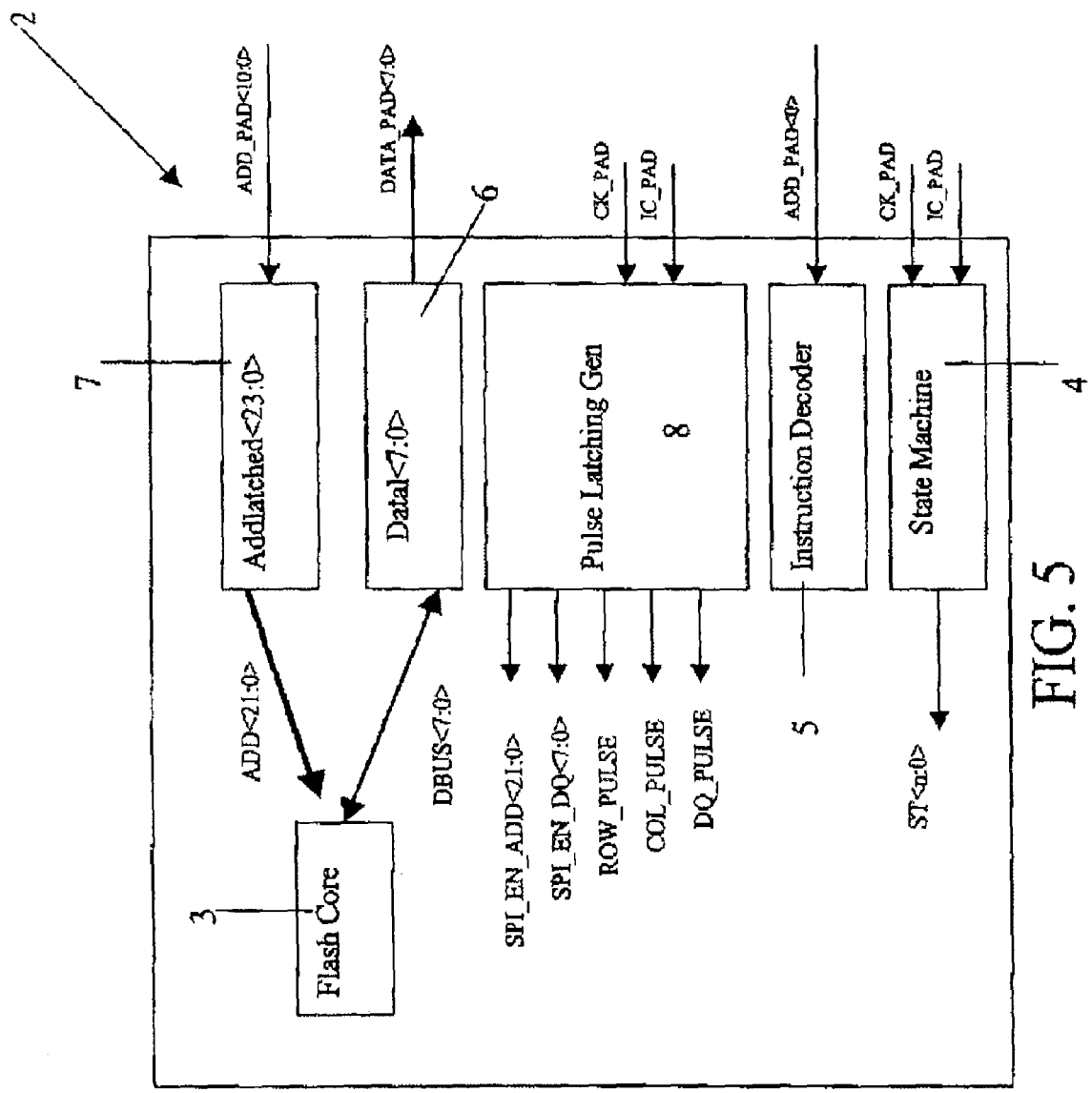
FIG. 5 is a schematic block view of the pseudo-parallel interface architecture incorporated in the device of FIG. 3 according to an embodiment of the invention.

FIG. 4 shows the timing signal sequence for data reading in this new mode.

The Clock signal pin serves as synchronism signal; the cell matrix columns are stored on the failing edges of this signal and reading is started by means of an ATD (Address Transition Detection) signal.

The cell matrix 3 rows are stored on the ATD signal rising edge and a new ATD pulse is started.

During a Clock-Pad signal complete cycle two memory locations can be read.

The block scheme of FIG. 3 shows the architecture according to an embodiment of the invention with the mixed SPI serial and pseudo-parallel interface 2, receiving also the signals IC_PAD, the data DATA_PAD<7:0> and the addresses ADD_PAD<10.0>.

The signal on the pin IC_PAD allows the one or the other interface to be chosen, i.e. the SPI serial or the parallel, the internal address and data buses will be forced by the one or the other communication phase interface.

Eleven pins ADD_PAD<10:0> are present for the address flow in the pseudo-parallel mode, one of them serving as input pin in the serial mode.

Eight data pins DATA_PAD<7:0> are present for the pseudo-parallel mode, one of them being the output pin in the SPI serial mode.

If compared to the prior art, the pins CK_PAD and the pin SELECT_PAD are unchanged.

The various structural blocks comprised in the pseudo-parallel interface 2 will now be analyzed in greater detail, in order to describe in greater detail the two operating modes.

A first block 4 "State Machine" receives the signals applied on the pins CK_PAD and on the pin SELECT_PAD and it generates the enabling signals (ST<n:0>) for the various further circuit blocks, according to the particular timing of the protocol used.

A second block 5 "Instruction Decoder" receives a signal from the least or less significant pin ADD_PAD<0> of the address pin group and it is in charge of decoding in the SPI serial mode the several protocol commands. This block 5 receives the information by the sole input pin ADD_PAD<0> of the address pins.

A third block 7 "Addlatched<23:0>" comprises a plurality of latch registers, preferably twenty-four registers, necessary for the temporary storage of the addresses ADD_PAD<10:0>.

A fourth block 6 "Datal<7:0>" comprises in turn a group of latch registers, particularly eight registers, and it serves to store temporarily the input and output data on the pins DATA_PAD<7:0>.

A fifth block 8 "Pulse Latching Gen" generates all the enabling signals necessary for the address and data load:

This fifth block 8 produces a series of signals described below:

SPI_EN_ADD<23:0> are the address bit latching pulses in the SPI mode; each pulse stores a sole address bit.

SPI_EN_DATA<7:0> are the enabling pulses for generating serially the output datum.

COL_PULSE and ROW_PULSE serves to store the ADD_PAD<10:0> content in the block 7 Addlatched as less significant part and as most significant part, respectively. These signals are used only in the pseudo-serial mode.

DQ_PULSE serves to generate output data in the pseudo-parallel mode.

Figure 6:
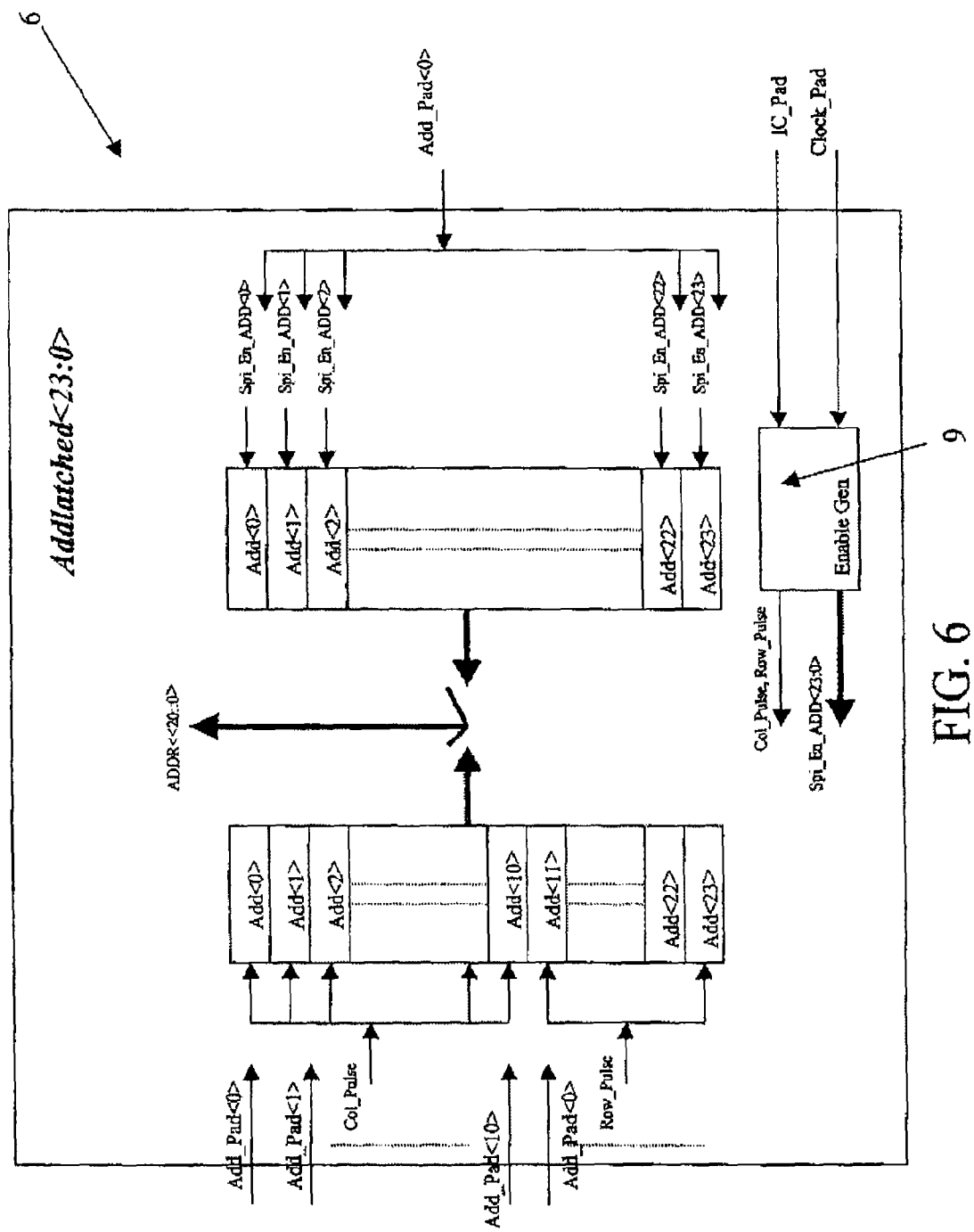
FIGS. 6 and 7 are respective schematic views showing fluxes of addresses and data exchanged in the interface of FIG. 5 according to an embodiment of the invention.
Figure 7:
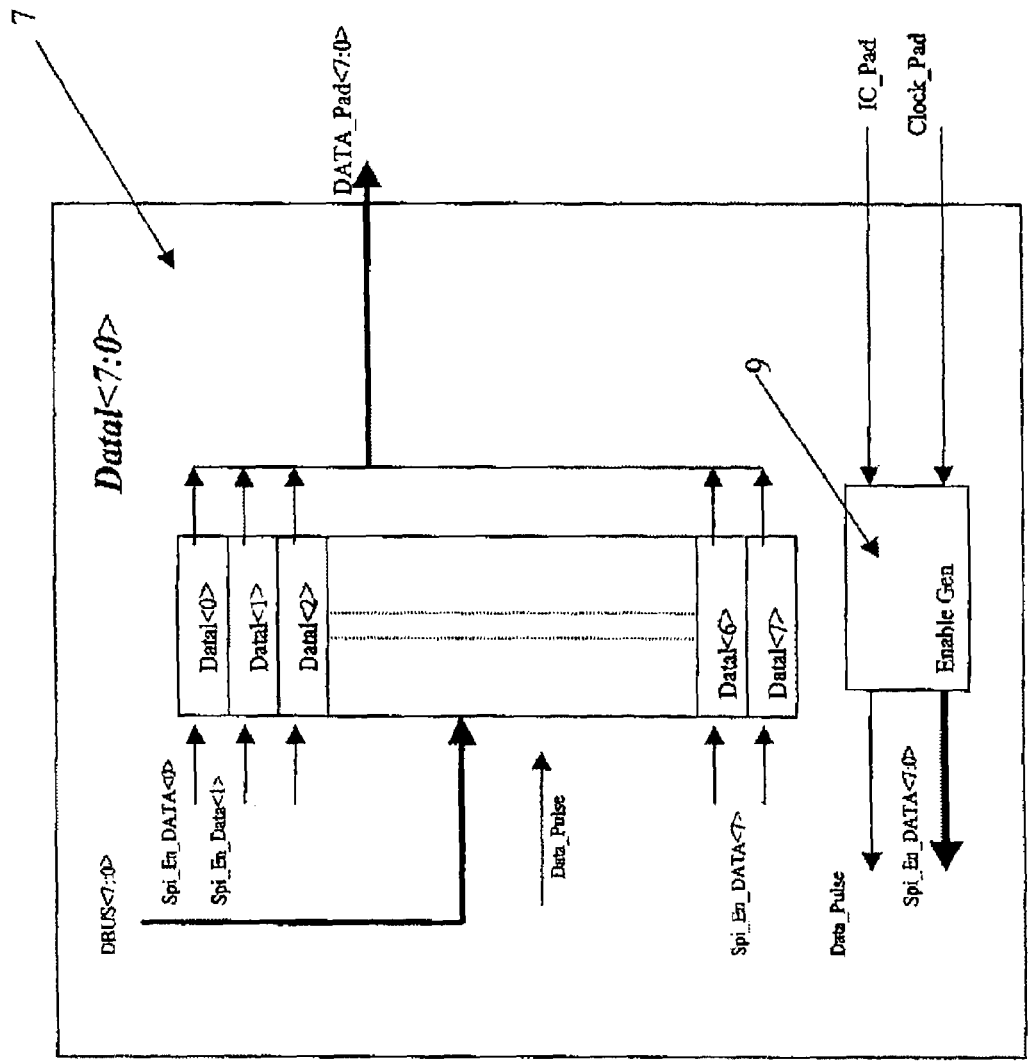

FIGS. 6 and 7 show in greater detail the address and data fluxes being exchanged in blocks 6 and 7 Addlatched and Datal.

The SPI serial mode will be analyzed first.

The enabling signals of the various address latches are generated on the clock signal rise front, therefore the twenty-four address bits are stored.

In the parallel mode, on the contrary, two latching signals are generated, the first signal Col_Pulse, fixing the content of the addresses of Add_Pad<10:0> on the first eleven address latches, less significant part, while the second signal Row_Pulse fixes the content of the addresses Add_Pad<10:0> in the most significant address latches.

Block 9 Enable Gen is intended to generate both the first and the following latching pulses on the basis of the logic value of signal IC deciding which of the two interfaces is to be used.

As far as the output data path is concerned, in a reading operation in the two modes, generally data come from the Flash memory cell matrix, indicated in the figures with Flash Core 3, through the DBUS<7:0> and they are stored in the various locations Data<7:0>.

Afterwards, in the SPI serial operating mode, data are transferred serially outside by means of the sole output pad and the enabling signals SPI_En_DATA<7:0>.

In alternative, in the parallel mode, data are transferred outside by means of the output pins DATA_PAD<7:0>all together in parallel on the rise front of the enabling signal DATA_PULSE.

The device according to the described embodiments of the present invention, through the simple addition of a combinatory logic, allows applications on SPI buses to be available and testing phases to be performed in reasonable times reducing as much as possible production and industrialization costs.

A memory device including the interface 2 may be included in a variety of different types of electronic systems, such as a computer system, personal digital assistant, cellular phone, and portable storage devices like USB drives.

From the foregoing it will be appreciated that, although specific embodiments of the invention have been described herein for purposes of illustration, various modifications may be made without deviating from the spirit and scope of the invention.

The invention claimed is:

1. A non volatile memory device architecture, for example of the Flash type, incorporating a memory cell matrix and an input/output interlace for receiving memory data and/or addresses from and to the outside of the device, said interface operating according to a serial communication protocol, and wherein the architecture comprises in said interface a further pseudo-parallel communication portion which is used only during an electrical wafer sort test process prior to final testing of the assembled memory device architecture, the pseudo-parallel communication portion having a low pin number and incorporating circuit blocks for selecting the one or the other communication mode against an input-received selection signal.

2. Architecture according to claim 1, wherein said circuit blocks comprise at least a state machine receiving a clock signal and a selection signal for activating the remaining blocks; an instruction decoder block for decoding in the SPI serial mode the various communication protocol commands and an enabling signal generator block for loading data and address registers.

3. Architecture according to claim 2, wherein said interface comprises also a latch register block to store temporarily input and output addresses on address pins.

4. Architecture according to claim 1, wherein said interface comprises also a latch register block to store temporarily input and output data on data pins.

5. Architecture according to claim 3, wherein said address latch registers are at least twenty-four.

6. Architecture according to claim 4, wherein said data latch registers are at least eight.

7. Architecture according to claim 3, wherein said address register block is associated to an enabling pulse generator block to generate latching pulses based on the logic value of a signal received by said signal generator block and it selects which one of the two serial or pseudo-parallel interface is to be used.

8. Architecture according to claim 4, wherein said data register block is associated to an enabling pulse generator block to generate latching pulses based on the logic value of a signal received by said signal generator block and it selects which one of the two serial or pseudo-parallel interface is to be used.

9. Architecture according to claim 1, wherein said signal generator block produces at least the following signals: SPI_EN_ADD<21:0> for enabling an address bit latching in the SPI serial mode; each pulse stores a sole address bit; SPI_EN_DATA<7:0> for enabling the serial generation of the output datum; COL_PULSE to store in the pseudo-parallel mode the content of the addresses in a register block as the less significant part; ROW_PULSE to store the content of the addresses in a register block as the most significant part; DQ_PULSE to generate output data still in the pseudo-parallel mode.

10. Architecture according to claim 1, wherein the architecture comprises eleven address pins for the address flow in the pseudo-parallel mode, one of them being used as input pin in the serial mode, as well as eight data pins for the pseudo-parallel mode, one of them being used as the output pin in the SPI serial mode.

11. A method of operating a memory device including a matrix of memory cells, comprising:
    during a normal mode of operation,
        serially receiving address bits on a pin of the memory device;
        sequentially latching the address bits;
        accessing memory cells in the matrix that correspond to the latched address bits; and
        serially providing bits of data stored in the accessed memory cells onto a pin of the memory device; and
    during a test mode of operation,
        receiving and storing a plurality of address bits in parallel, the bits being applied on respective pins of the device;
        accessing memory cells in the matrix that correspond to the stored address bits; and
        providing in parallel bits of data stored in the accessed memory cells onto pins of the memory device.

12. The method of claim 11 wherein the test mode of operation comprises an electrical wafer sort test mode.

13. The method of claim 11 wherein receiving and storing a plurality of address bits in parallel comprises receiving and storing a column address including a plurality of bits and receiving and storing a row address including a plurality of bits.

14. The method of claim 11 wherein at least some of the respective pins of the memory device on which the plurality of address bits are received in the test mode are not accessible during the normal mode of operation.

15. A memory device, comprising:
    a matrix of memory cells; and
    an interface coupled to the matrix of memory cells and coupled to pins of the memory device, the interface operable during a normal operation of the memory device in a serial mode responsive to control signals applied on respective pins to serially receive addresses and data and to provide these addresses and data in parallel form to the matrix of memory cells, and operable during testing of the memory device in a parallel mode responsive to the control signals to receive parallel address and data applied on external pins and to apply this data in parallel form to the matrix of memory cells.

16. The memory device of claim 15 wherein the testing of the memory device comprises an electrical wafer sort test of the memory device.

17. The memory device of claim 15 wherein the matrix of memory cells comprises a matrix of flash memory cells.

18. The memory device of claim 15 wherein the interface comprises:
    a plurality of latches operable to serially latch address bits applied on an external pin of the device;
    a data output circuit operable to receive a parallel data word from the matrix to serially output bits of this data word during the serial mode and to output the bits in parallel during the parallel mode;
    a control circuit operable responsive to control signals applied on external pins to apply control pulses to the latches and data output circuit to control the circuit during the serial and parallel modes;

an instruction decoder operable in the serial mode to serially receive address bits applied on a respective pin of the device and to decode the serially received bits to develop a corresponding serial mode command that is utilized in controlling the data output and control circuits; and a state machine operable to receive the control signals applied to the control circuit to apply enable signals to latches, data output circuit, control circuit, and instruction decoder.

19. The memory device of claim 15 wherein the device further comprises a package that houses the matrix and the interface and that includes a plurality of external pins coupled to the interface, and wherein at least some of the pins utilized by the interface during the parallel mode are not coupled to external pins of the package.

20. A computer system comprising computer circuitry coupled to a memory device, the memory device including,
   a matrix of memory cells; and
   an interface coupled to the matrix of memory cells and coupled to external pins of the memory device, the interface operable during normal operation of the memory device in a serial mode responsive to control signals applied on respective pins to serially receive addresses and data and to provide these addresses and data in parallel form to the matrix of memory cells, and operable during testing of the memory device in a parallel mode responsive to the control signals to receive parallel address and data applied on external pins and to apply this data in parallel form to the matrix of memory cells.

21. The computer system of claim 20 wherein the memory device comprises a flash memory device.

22. The computer system of claim 20 wherein at least some of the external pins on which the address is received during testing of the memory device are not accessible during normal mode of the memory device.

23. The computer system of claim 20 wherein the memory device further comprises a package that houses the matrix and the interface and that includes a plurality of external pins coupled to the interface, and wherein at least some of the pins utilized by the interface during the parallel mode are not coupled to external pins of the package.

24. The computer system of claim 20 wherein the interface comprises:
   a plurality of latches operable to serially latch address bits applied on an external pin of the device;
   a data output circuit operable to receive a parallel data word from the matrix to serially output bits of this data word during the serial mode and to output the bits in parallel during the parallel mode;
   a control circuit operable responsive to control signals applied on external pins to apply control pulses to the latches and data output circuit to control the circuit during the serial and parallel modes;
   an instruction decoder operable in the serial mode to serially receive address bits applied on a respective pin of the device and to decode the serially received bits to develop a corresponding serial mode command that is utilized in controlling the data output and control circuits; and
   a state machine operable to receive the control signals applied to the control circuit to apply enable signals to latches, data output circuit, control circuit, and instruction decoder.

* * * * *